United States Patent
Chung et al.

(10) Patent No.: US 8,110,418 B2
(45) Date of Patent: Feb. 7, 2012

(54) ORGANIC ELECTROLUMINESCENT DISPLAY DEVICE AND METHOD OF FABRICATING THE SAME

(75) Inventors: In-Jae Chung, Gyeonggido (KR); Ki-Yong Kim, Gyeonggido (KR); Chang-Wook Han, Seoul (KR); Kwang-Jo Hwang, Gyeonggido (KR)

(73) Assignee: LG Display Co., Ltd., Seoul (KR)

( * ) Notice: Subject to any disclaimer, the term of this patent is extended or adjusted under 35 U.S.C. 154(b) by 101 days.

(21) Appl. No.: 12/824,771

(22) Filed: Jun. 28, 2010

(65) Prior Publication Data
US 2010/0267178 A1  Oct. 21, 2010

Related U.S. Application Data

(62) Division of application No. 11/117,572, filed on Apr. 29, 2005, now Pat. No. 7,768,060.

(30) Foreign Application Priority Data

Apr. 29, 2004 (KR) .............................. 2004-0030092

(51) Int. Cl.
*G11C 16/04* (2006.01)

(52) U.S. Cl. ...... 438/22; 438/151; 438/157; 365/185.08

(58) Field of Classification Search .................. 257/403; 438/151, 22, 157; 365/185.08
See application file for complete search history.

(56) References Cited

U.S. PATENT DOCUMENTS

| | | | | |
|---|---|---|---|---|
| 5,043,946 A * | 8/1991 | Yamauchi et al. | ....... | 365/185.08 |
| 5,488,243 A * | 1/1996 | Tsuruta et al. | ................ | 257/314 |
| 5,801,993 A * | 9/1998 | Choi | ........................ | 365/185.28 |
| 5,963,476 A * | 10/1999 | Hung et al. | .............. | 365/185.22 |
| 5,981,335 A * | 11/1999 | Chi | ................... | 438/253 |
| 6,201,734 B1 * | 3/2001 | Sansbury et al. | ........... | 365/185.1 |
| 6,248,626 B1 * | 6/2001 | Kumar et al. | ................. | 438/257 |
| 6,638,627 B2 * | 10/2003 | Potter | ........................ | 428/446 |
| 6,674,138 B1 * | 1/2004 | Halliyal et al. | .............. | 257/411 |
| 6,903,969 B2 * | 6/2005 | Bhattacharyya | ........ | 365/185.08 |
| 2002/0048190 A1 * | 4/2002 | King | ........................ | 365/185.18 |
| 2002/0105023 A1 * | 8/2002 | Kuo et al. | ..................... | 257/318 |
| 2004/0007734 A1 * | 1/2004 | Kato et al. | .................... | 257/324 |

* cited by examiner

*Primary Examiner* — Michael Shingleton
(74) *Attorney, Agent, or Firm* — McKenna Long & Aldridge, LLP.

(57) ABSTRACT

An organic electroluminescent display device includes a substrate, gate and data lines on the substrate and crossing each other to define a pixel region, a switching element at each crossing point of the gate and data lines, a driving element coupled to the switching element, a field control electrode coupled to the driving element and overlapping a channel of the driving element, and an organic electroluminescent diode coupled to the driving element.

9 Claims, 12 Drawing Sheets

ORGANIC ELECTROLUMINESCENT DISPLAY DEVICE AND METHOD OF FABRICATING THE SAME

This application is a divisional application of U.S patent application Ser. No. 11/117,572, filed on Apr. 29, 2005, now U.S. Pat. No. 7,768,060 which claims the benefit of Korean Patent Application No. 2004-0030092, filed in Korea on Apr. 29, 2004, all of which are hereby incorporated by reference for all purposes as if fully set forth herein.

BACKGROUND OF THE INVENTION

1. Field of the Invention

The present invention relates to an electroluminescent display device, and more particularly, to an organic electroluminescent display device including thin film transistors with amorphous silicon as active layers and a method of fabricating the same. Although the present invention is suitable for a wide scope of applications, it is particularly suitable for improving shift of threshold voltage and decreasing current in an organic electroluminescent display device.

2. Discussion of the Related Art

In general, an organic electroluminescent display device emits light by injecting electrons from a cathode electrode and holes from an anode electrode into an emissive layer, combining the electrons and the holes to generate an exciton, and by transiting the exciton from an excited state to a ground state. Since the organic electroluminescent display device does not require an additional light source due to its self-luminescence property, the organic electroluminescent display device has a small size and is light in weight, as compared to a liquid crystal display device. The organic electroluminescent display device also has a low power consumption, high brightness, and a short response time. Thus, the organic electroluminescent display device is used in many consumer electronic applications, such as cellular phones, car navigation systems (CNSs), personal digital assistants (PDAs), camcorders, and palm PCs. In addition, the organic electroluminescent display device can reduce manufacturing costs because of its simple manufacturing processes.

Organic electroluminescent display devices may be categorized into a passive matrix-type and an active matrix-type depending upon the method used to drive the device. Passive matrix-type organic electroluminescent display devices have a simple structure and are fabricated through a simple manufacturing process. However, the passive matrix-type organic electroluminescent display devices have high power consumption, thereby preventing use in large area displays. Furthermore, in passive matrix organic electroluminescent display devices, an aperture ratio decreases due to the increased number of electrical lines. Thus, the passive matrix-type organic electroluminescent display devices are commonly used as small-sized display devices. On the other hand, active matrix-type organic electroluminescent display (AMOELD) devices are commonly used as large-sized display devices since they have a high luminous efficiency, and provide high definition images.

FIG. 1 is a cross-sectional view of an active matrix-type organic electro-luminescent display (AMOELD) device according to the related art. In FIG. 1, the AMOELD device 10 includes a first substrate 12 and a second substrate 28, which are spaced apart and face each other. The first substrate 12 may be transparent and flexible. A plurality of thin film transistors T and a plurality of first electrodes 16 are formed on an inner surface of the first substrate 12, in which each of first electrodes 16 is connected to the respective thin film transistor T. Organic layers 18 are formed on the first electrodes 16 and the thin film transistors T, and a second electrode 20 is formed on the organic layers 18. The organic layers 18 emit light of three colors: red (R), green (G), and blue (B) within a pixel region P, and are generally formed by patterning an organic material that emits one of red, green and blue.

A desiccant 22 is formed on an inner surface of the second substrate 28 to remove any external moisture and air that may permeate into the space between the first and second substrates 12 and 28. The inner surface of the second substrate 28 is patterned to form a groove, and the desiccant 22 is disposed within the groove and is fastened with a tape 25.

A sealant 26 is formed between the first and second substrates 12 and 28 to attach the first and second substrates 12 and 28, and surrounds elements, such as the thin film transistors T, the first electrodes 16, the organic layers 18, and the second electrodes 20. The sealant 26 forms an airtight space to protect the elements from the external moisture and air. The first electrode 16 functions as an anode electrode and is transparent. Thus, this AMOELD device has a bottom emission type, in which light is emitted through the first electrode 16.

FIG. 2 is an equivalent circuit for a pixel of an organic electroluminescent display (OELD) device according to the related art. As shown in FIG. 2, a gate line 13 is formed along one direction of a substrate 12 and a data line 15 crosses the gate line 13. A switching element $T_S$ is formed at a crossing point of the gate line 13 and the data line 15, and a driving element $T_D$ is electrically connected to the switching element $T_S$.

A storage capacitor $C_{ST}$ is disposed between a source electrode of the driving element $T_D$ and a gate electrode of the driving element $T_D$, and a drain electrode of the driving element $T_D$ is connected to a first electrode of an organic electroluminescent diode E. A second electrode of the organic electroluminescent diode E is connected to a power supply line 21, which supplies a power source $V_{DD}$.

The OELD device having the above structure can be driven as follows.

First, when a gate ON signal is applied to a gate electrode of the switching element $T_S$, a current signal flowing through the data line 49 is changed into a voltage signal through the switching element $T_S$ and is applied to the gate electrode of the driving element $T_D$. Then, the driving element $T_D$ turns on, and thus the gray scale is realized by determining levels of the current flowing through the organic electroluminescent diode E.

At this time, because signals stored in the storage capacitor $C_{ST}$ maintain the signal of the gate electrode of the driving element $T_D$, the level of the current flowing through the organic electroluminescent diode E is kept constant until a next signal is applied even if the switching element $T_S$ turns off. The switching element $T_S$ and the driving element $T_D$ may be an amorphous silicon thin film transistor or a polycrystalline silicon thin film transistor. The amorphous silicon thin film transistor is more simply manufactured as compared with the polycrystalline silicon thin film transistor.

FIG. 3 is a cross-sectional view illustrating a driving element having an amorphous silicon thin film transistor for an OELD device according to the related art.

In FIG. 3, a gate electrode 34 of the driving element is formed on a substrate 30. A gate insulating layer 38 is formed on the entire surface of the substrate 30 having the gate electrode 34 thereon. A semiconductor layer 58 is formed on the gate insulating layer 38. The semiconductor layer 58 includes an active layer 58a and an ohmic contact layer 58b that are sequentially deposited. A part of the active layer 58a functions as a channel CH of the driving element. Source and drain electrodes 52 and 54 are formed on the semiconductor layer 58. The source and drain electrodes 52 and 54 contact the ohmic contact layer 58b and are spaced apart from each other. A first passivation layer 60 is formed on the entire surface of the substrate 30 including the source and drain electrodes 52 and 54 thereon, and a ground line 62 is formed on the first passivation layer 60 to earth the source electrode 52. A second passivation layer 64 is formed on the entire surface of the substrate 30 including the ground line 62, and a first electrode 66 of an organic electroluminescent diode is formed on the second passivation layer 64 in a pixel region. The first electrode 66 contacts the drain electrode 54. Although not shown in the figure, an organic light-emitting layer and a second electrode are formed on the first electrode 66. Current uniformly flows through the organic light-emitting layer while a signal on the gate electrode of the driving element is kept constant until the next signal is applied. However, the current may decrease due to long term degradation of the driving element.

FIG. 4A is a graph illustrating voltage versus current (V-I) characteristics of a driving element and an organic electroluminescent diode according to the related art. FIG. 4B is a graph illustrating time versus variation of current through the organic electroluminescent diode in the related art. As shown in FIG. 4A, curves M1 and M2 illustrate voltage versus current characteristics of the driving element, and curves N1 and N2 illustrate voltage versus current characteristics of the organic electroluminescent diode in the relate art. The curves M1 and N1 correspond to the case that time t is $t_0$, that is, a gate ON signal $V_0$ is applied on the gate electrode of the driving element. The curves M2 and N2 correspond to the case that time t is $t_1$, that is, the gate ON signal on the gate electrode of the driving element becomes $V_1$ due to the long term degradation of the driving element, wherein $V_1$ is lower than $V_0$. Thus, the current I flowing through the organic electroluminescent diode decreases from $I_0$ at t=$t_0$ to $I_1$ at t=$t_1$. Accordingly, as shown in FIG. 4B, the current I decreases until the half-life of the organic electroluminescent diode.

FIG. 5 illustrates a surface potential between an active layer and a gate insulating layer of a driving element of the related art, i.e., along line A-A' of FIG. 3, in a saturation region when the driving element turns ON. As shown in FIG. 5, the surface potential concentrates in a region corresponding to an edge portion D of the drain electrode 54 of FIG. 3. Therefore, in the region corresponding to the edge portion D of the drain electrode 54, defects are formed due to bond-breaking of a Si—Si weak bond in the active layer 58a of FIG. 3 and charge-trapping. Accordingly, a threshold voltage is shifted to decrease current flowing through the organic electroluminescent diode. Brightness and life span of the OELD are reduced due to the decreased current and the defects.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic electroluminescent display device and a method of fabricating the same that improve shift of threshold voltage and decrease current.

Another object of the present invention is to provide an organic electroluminescent display device and a method of fabricating the same that improve a surface potential between an active layer and a gate insulating.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes a substrate, gate and data lines on the substrate and crossing each other to define a pixel region, a switching element at each crossing point of the gate and data lines, a driving element coupled to the switching element, a field control electrode coupled to the driving element and overlapping a channel of the driving element, and an organic electroluminescent diode coupled to the driving element.

In another aspect of the present invention, a method of fabricating an organic electroluminescent display device includes forming gate and data lines on a substrate, the gate and data lines crossing each other to define a pixel region, forming a switching element at each crossing point of the gate and data lines, forming a driving element coupled to the switching element, forming a field control electrode coupled to the driving element and overlapping a channel of the driving element; and forming an organic electroluminescent diode connected to the driving element.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 5 is a view illustrating a surface potential between an active layer and a gate insulating layer of a driving element of the related art in a saturation region when the driving element turns ON;

FIG. 9 is a view illustrating a surface potential between an active layer and a gate insulating layer of a driving element according to an exemplary embodiment of the present invention in a saturation region when the driving element turns ON.

DETAILED DESCRIPTION OF THE ILLUSTRATED EMBODIMENTS

Reference will now be made in detail to the illustrated embodiment of the present invention, an example of which is illustrated in the accompanying drawings.

Figure 1:
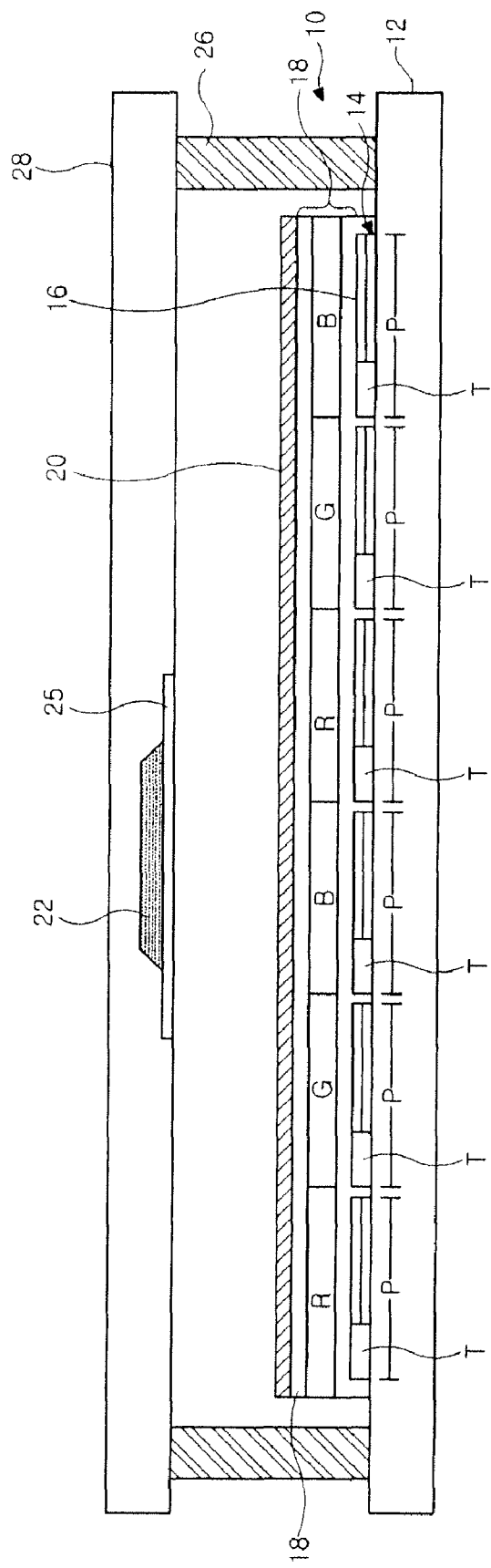
FIG. 1 is a cross-sectional view of an active matrix-type organic electroluminescent display device according to the related art.
Figure 2:
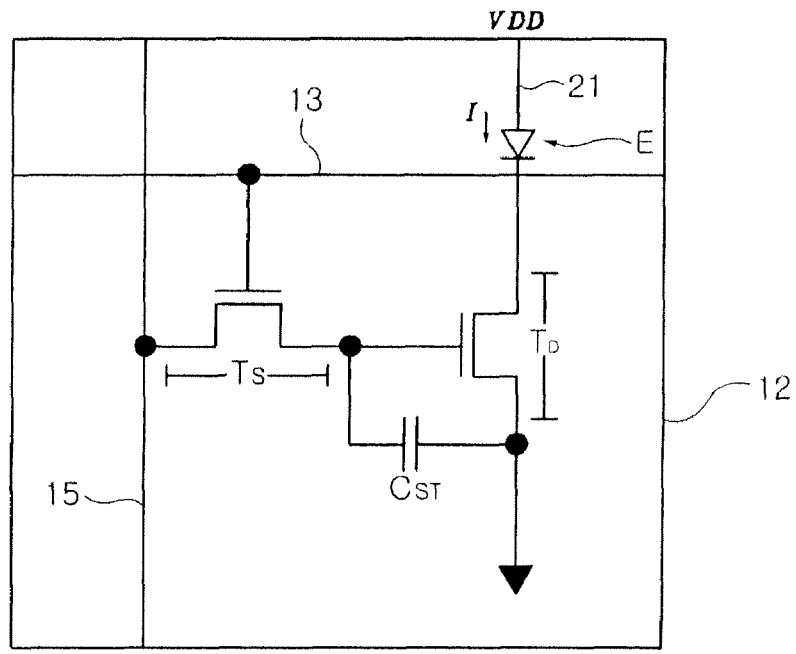
FIG. 2 is an equivalent circuit for a pixel of an organic electroluminescent display device according to the related art.
Figure 3:
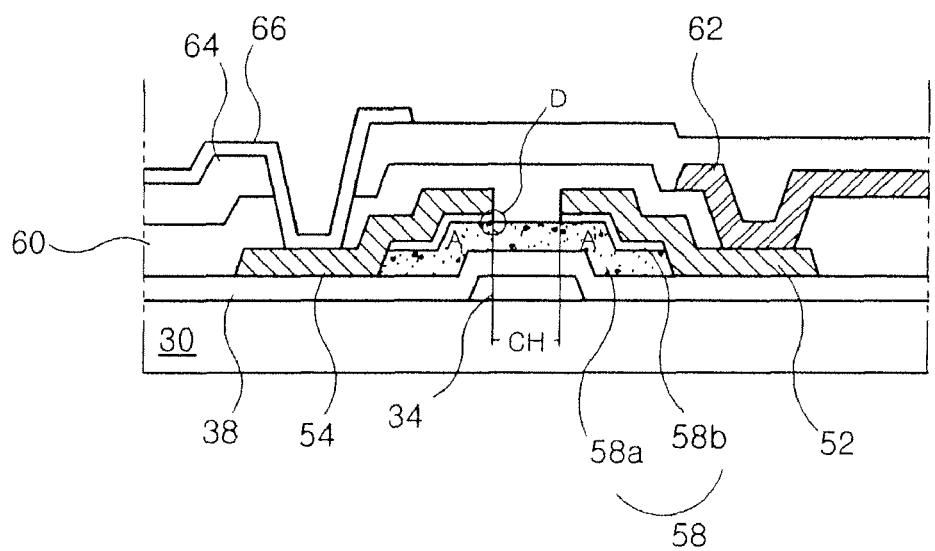
FIG. 3 is a cross-sectional view illustrating a driving element having an amorphous silicon thin film transistor for an organic electroluminescent display device according to the related art.
Figure 4A:
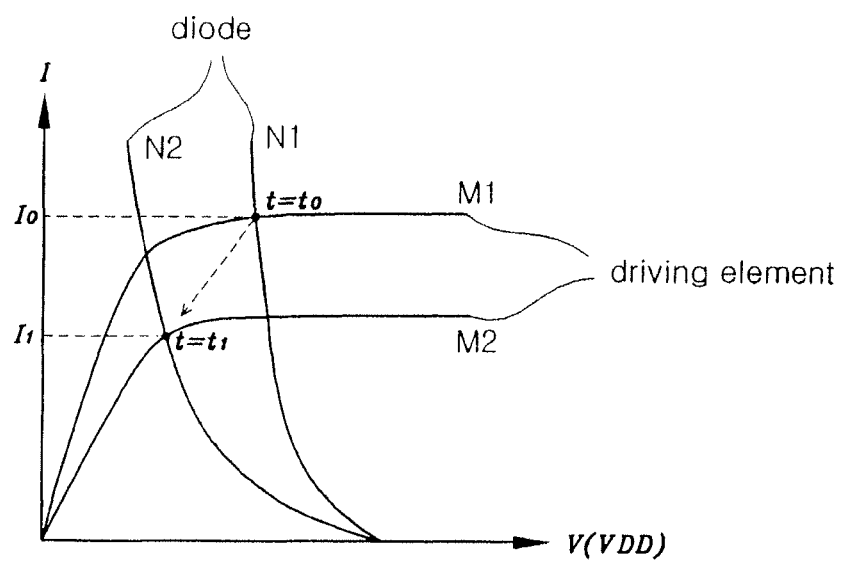
FIG. 4A is a graph illustrating voltage versus current (V-I) characteristics of a driving element and an organic electroluminescent diode according to the related art.
Figure 4B:
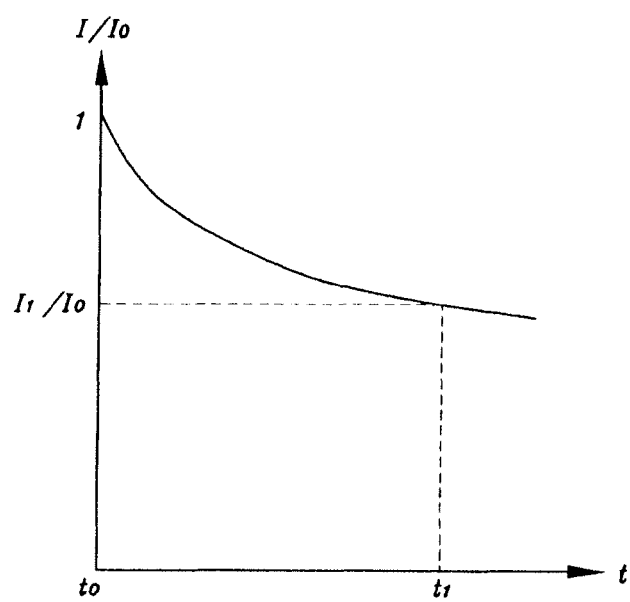
FIG. 4B is a graph illustrating time versus variation of current through an organic electroluminescent diode in the related art.
Figure 5:
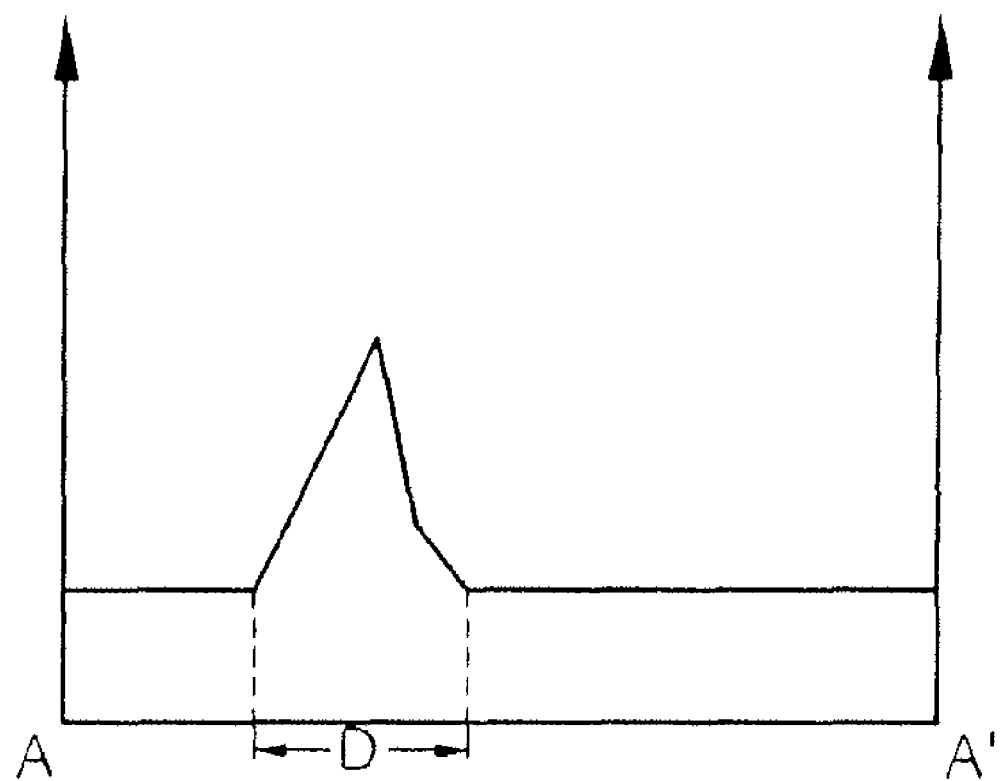
Figure 6:
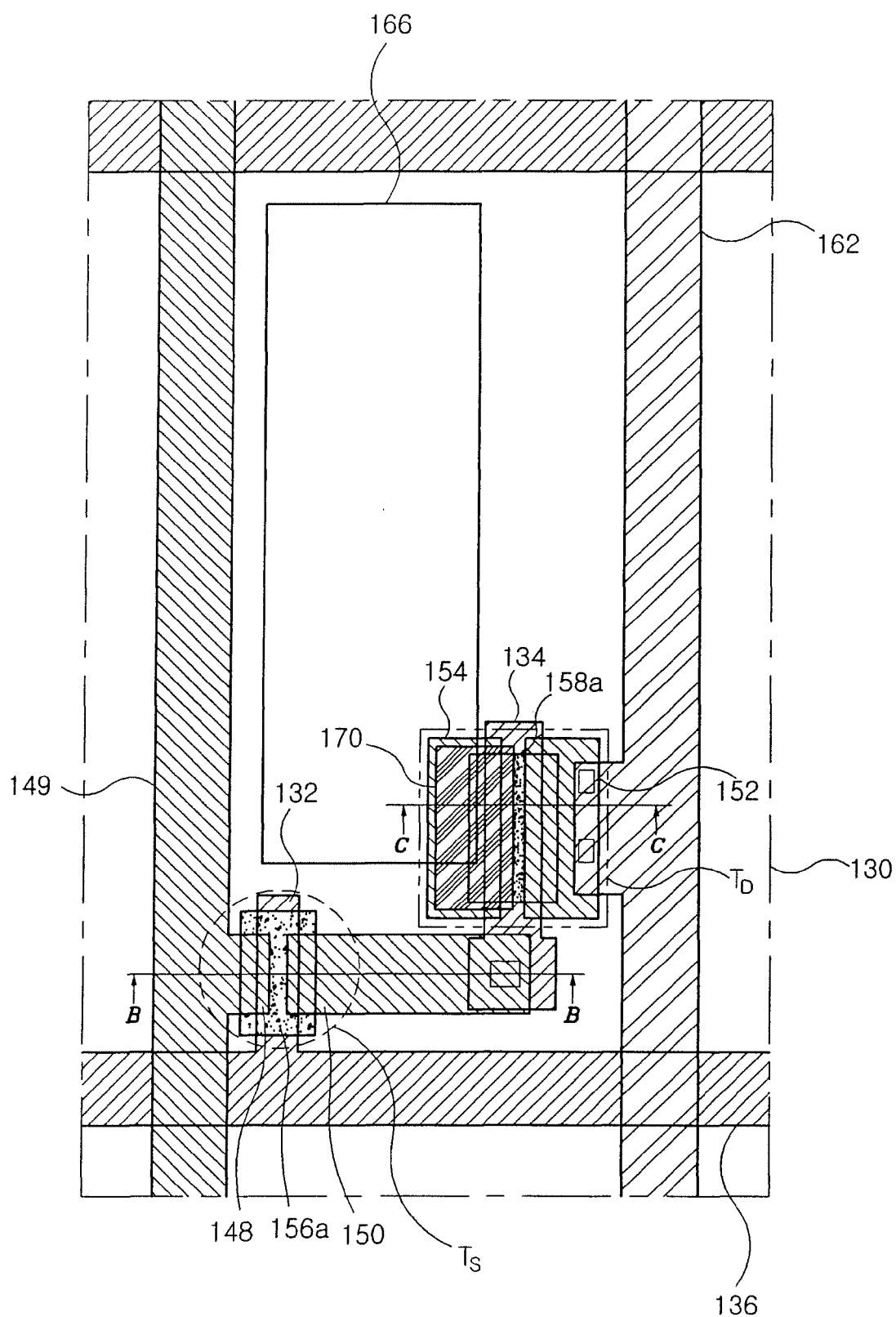
FIG. 6 is a plan view of an organic electroluminescent display device according to an exemplary embodiment of the present invention.
Figure 7:
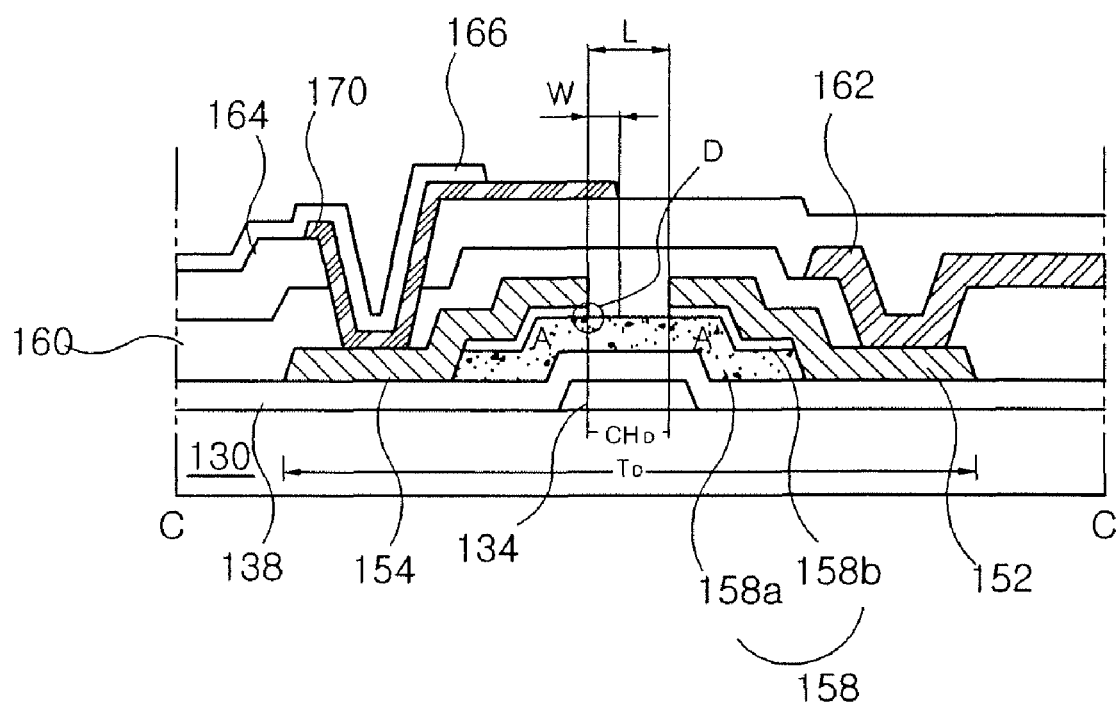
FIG. 7 is a cross-sectional view illustrating a driving element of the organic electroluminescent display device shown in FIG. 6.
Figure 8:
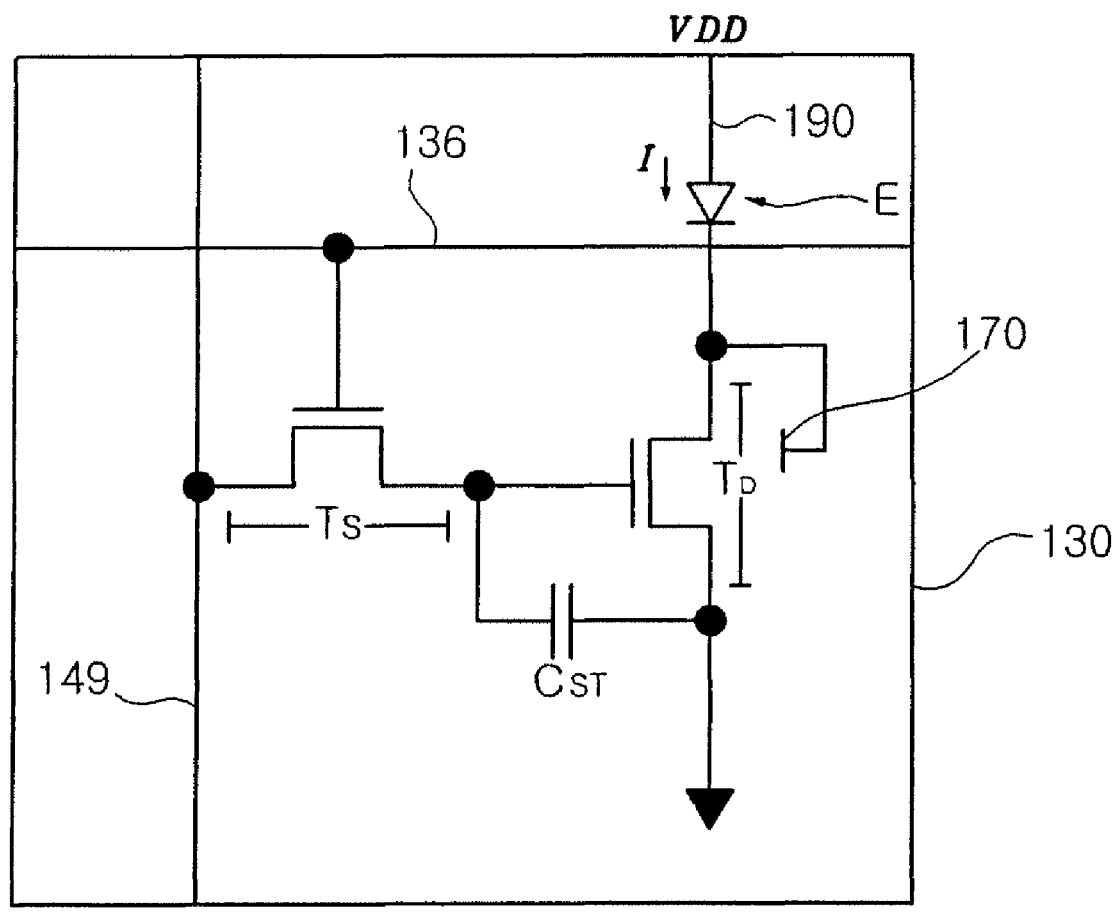
FIG. 8 is an equivalent circuit of a pixel for the organic electroluminescent display device shown in FIG. 6.

FIG. 6 is a plan view of an organic electroluminescent display (OELD) device according to an exemplary embodiment of the present invention. FIG. 7 is a cross-sectional view along line C-C of FIG. 6 and illustrates a driving element of the OELD device shown in FIG. 6. FIG. 8 is an equivalent circuit of a pixel for the OELD device shown in FIG. 6. In an embodiment of the present invention, an amorphous silicon thin film transistor may be used as a switching element and a driving element.

As shown in the figures, a gate line 136 is formed on a substrate 130 along a direction, and a data line 149 crosses the gate line 136 to define a pixel region. A ground line 162 is parallel to the data line 149 crossed the gate line 136.

A switching element $T_S$ is formed at a crossing point of the gate and data lines 136 and 149, and a driving element $T_D$ is connected to the switching element $T_S$. In an embodiment of the present invention, an n-type thin film transistor is used for the switching element $T_S$ and the driving element $T_D$. Alternatively, a p-type thin film transistor may be used for the switching element $T_S$ and the driving element $T_D$. The switching element $T_S$ includes a first gate electrode 132, a first source electrode 148, a first drain electrode 150, and a first active layer 156a of amorphous silicon. The driving element $T_D$ includes a second gate electrode 134, a second source electrode 152, a second drain electrode 154, and a second active layer 158a of amorphous silicon. The second gate electrode 134 is connected to the first drain electrode 150, the second source electrode 152 is connected to the ground line 162, and the second drain electrode 154 is connected to a field control electrode 170. The field control electrode 170 is disposed over the driving element $T_D$. The field control electrode 170 partially overlaps a channel $CH_D$ of the second active layer 158 and is connected to a first electrode 166 formed in the pixel region.

Although not shown in the figures, an organic light-emitting layer and a second electrode are formed on the first electrode 166. The first and second electrodes and the organic light-emitting layer constitute an organic electroluminescent diode E. A power line 190 is connected to the second electrode to provide a power source $V_{DD}$.

When the driving element $V_D$ turns ON, current I flows through the organic electroluminescent diode E and the driving element $V_D$.

In an embodiment of the present invention, the first electrode functions as a cathode electrode having a relatively low work function, and the second electrode functions as an anode electrode having a relatively high work function. Alternatively, the first electrode may function as an anode electrode, and the second electrode may function as a cathode electrode.

As shown in FIG. 8, a storage capacitor $C_{ST}$ is formed between the second gate electrode 134 and the second source electrode 152. Even if the switching element $T_S$ turns off, the storage capacitor $C_{ST}$ maintains the driving element $T_D$ in an ON state until the next signal is applied.

The driving element for the OELD device of an exemplary embodiment of the present invention will be explained in more detail.

The field control electrode 170 overlaps the channel $CH_D$ of the driving element $T_D$, an overlapping width W between the field control electrode 170 and the channel $CH_D$ is shorter than a channel length (i.e., a distance between the source and drain electrodes) L, and more particularly, W<L/2. As stated above, the field control electrode 170 is connected to the second drain electrode 154 and is also connected to the first electrode 166 of the organic electroluminescent diode E.

When the driving element $T_D$ turns ON, voltage, for example, positive (+) voltage, is applied to the field control electrode 170 through the second drain electrode 154. The positive voltage applied to the field control electrode 170 offsets the external field applied to the second gate electrode 134 because the field control electrode 170 is disposed over the driving element $T_D$. Accordingly, the surface potential between the second active layer 158a and the gate insulating layer 138 is decreased.

Meanwhile, the field control electrode may be connected to the source electrode of the driving element, and thus the field control electrode may be grounded.

Figure 9:
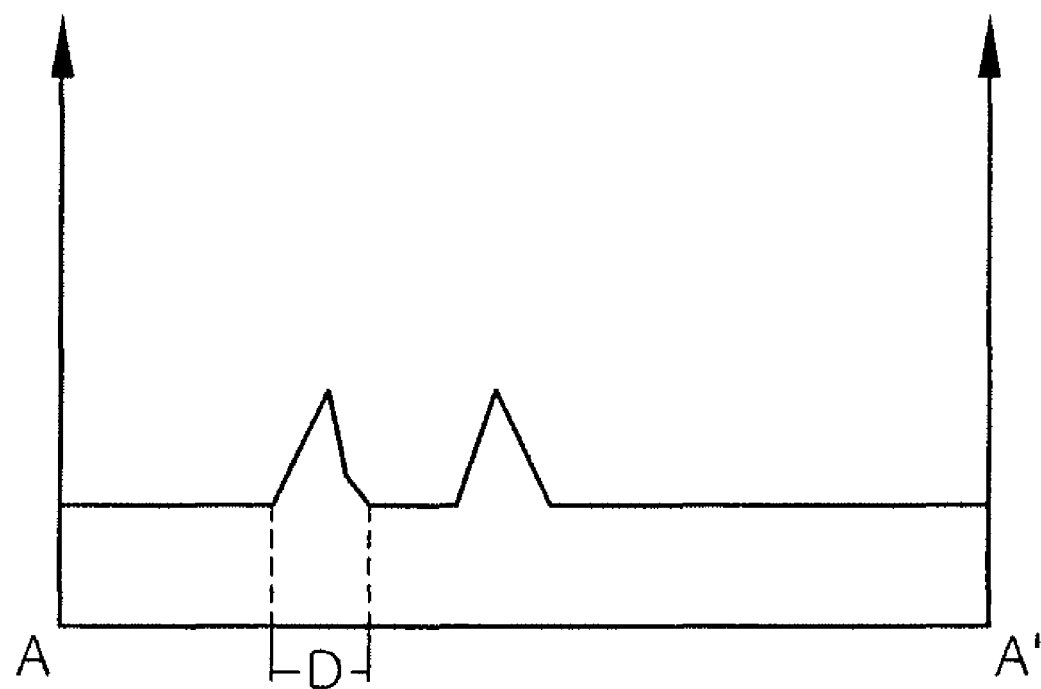

FIG. 9 illustrates a surface potential between an active layer and a gate insulating layer of a driving element according to an exemplary embodiment of the present invention, i.e., along line A-A' of FIG. 7, in a saturation region when the driving element turns ON.

First and second peaks are shown in FIG. 9. The first peak is generated due to the second drain electrode 154 of FIG. 7, and the second peak is generated due to the field control electrode 170 of FIG. 7. The surface potential in a region corresponding to an edge portion D of the second drain electrode 154 of FIG. 7, which includes the first peak, is reduced as compared with the surface potential of the related art because of an offset of the external field by the field control electrode 170 of FIG. 7. Therefore, defects are decreased, and the threshold voltage of the driving element TD is lowered, thereby improving decrease of the current flowing through the organic electroluminescent diode.

A manufacturing method of an organic electroluminescent display device will be explained with reference to attached drawings.

FIGS. 10A, 11A, 12A and 13A illustrate a manufacturing method of a switching element according to an exemplary embodiment of the present invention and correspond to cross-sections along line B-B of FIG. 6. FIGS. 10B, 11B, 12B and 13B illustrate a manufacturing method of a driving element according to an exemplary embodiment of the present invention and correspond to cross-sections along line C-C of FIG. 6.

Figure 10A:
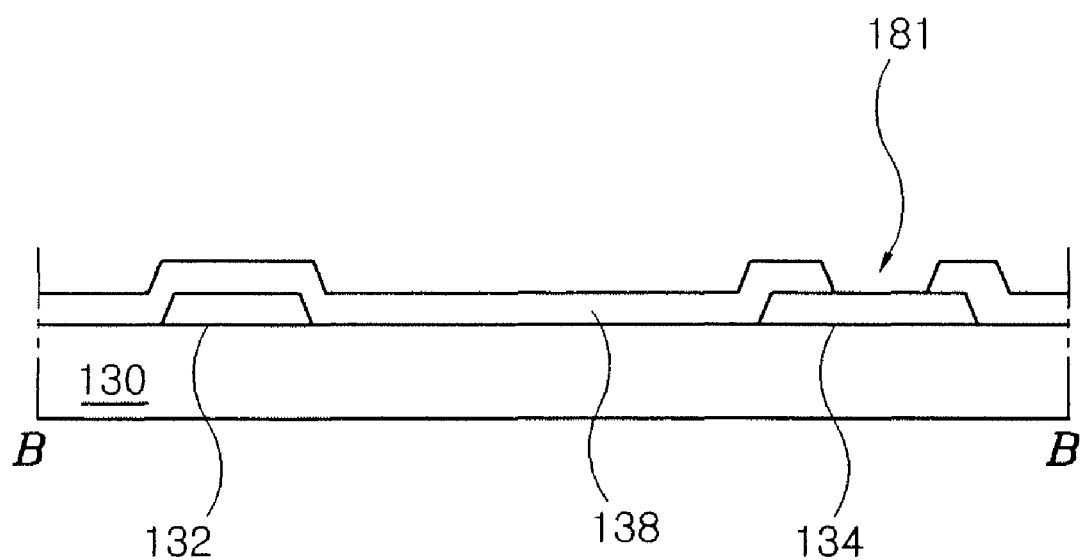
FIGS. 10A and 10B, FIGS. 11A and 11B, FIGS. 12A and 12B and FIGS. 13A and 13B are cross-sectional views illustrating a manufacturing method of a switching element and a driving element according to an exemplary embodiment of the present invention.
Figure 10B:
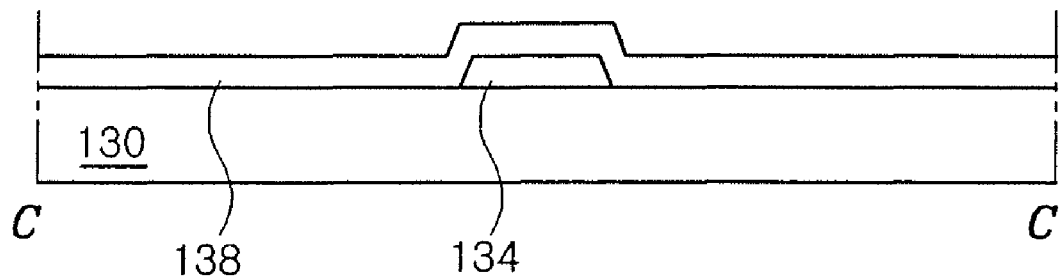

As shown in FIGS. 10A and 10B, a gate line 136 of FIG. 6 and first and second gate electrodes 132 and 134 are formed on a substrate 130 by sequentially depositing and patterning a metallic material. The metallic material includes aluminum (Al), an aluminum alloy such as AlNd, tungsten (W), copper (Cu), molybdenum (Mo) and titanium (Ti).

A gate insulating layer 138, a first insulating layer, is formed on the entire surface of the substrate 130 including the gate line and the first and second gate electrodes 132 and 134 thereon by sequentially depositing and patterning an inorganic insulating material including one of silicon nitride ($SiN_x$) and silicon oxide ($SiO_2$). The gate insulating layer 138 has a first contact hole 181 exposing a portion of the second gate electrode 134.

Figure 11A:
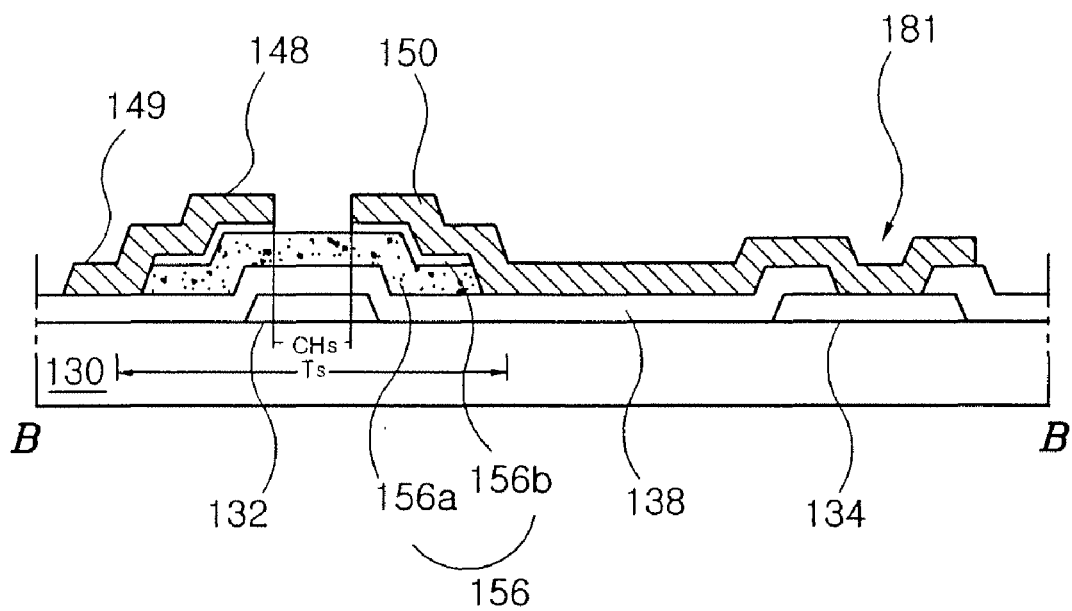
Figure 11B:
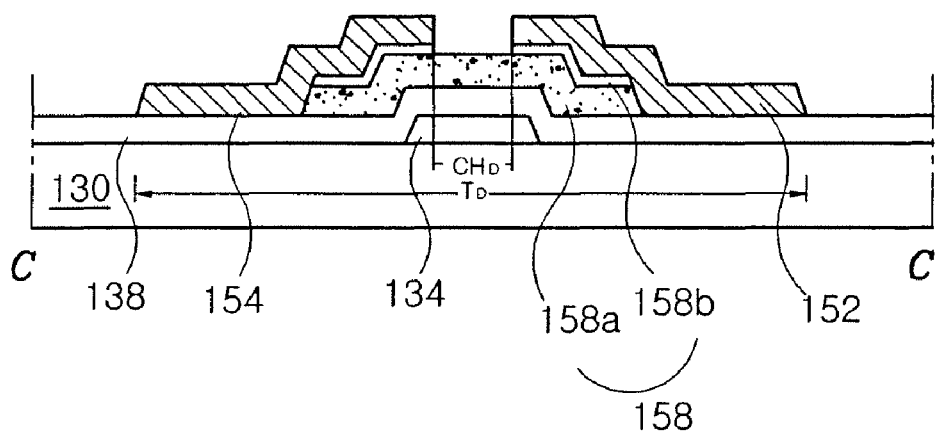

As shown in FIGS. 11A and 11B, first and second semiconductor layers 156 and 158 are formed on the gate insulating layer 138 over the first and second gate electrodes 132 and 134, respectively, by sequentially depositing and patterning intrinsic amorphous silicon (a-Si:H) and impurity-doped amorphous silicon. The first semiconductor layer 156 includes a first active layer 156a of intrinsic amorphous silicon and a first ohmic contact layer 156b of impurity-doped amorphous silicon. The second semiconductor layer 158 includes a second active layer 158a of intrinsic amorphous silicon and a second ohmic contact layer 158b of impurity-doped amorphous silicon.

A data line 149, first source and drain electrodes 148 and 150, and second source and drain electrodes 152 and 154 are formed on the substrate 130 including the first and second semiconductor layers 156 and 158 thereon by sequentially depositing and patterning a metallic material. The metallic material includes aluminum (Al), an aluminum alloy such as AlNd, tungsten (W), copper (Cu), molybdenum (Mo) and titanium (Ti). The first source and drain electrodes 148 and 150 are spaced apart from each other, and the second source and drain electrodes 152 and 154 are spaced apart from each other.

Next, the first and second ohmic contact layers 156b and 158b are removed between the first source and drain electrodes 148 and 150 and between the second source and drain electrodes 152 and 154. The first and second active layers 156a and 158a become channels $CH_S$ and $CH_D$ of a switching element $T_S$ and a driving element $T_D$, respectively.

The first gate electrode 132, the first semiconductor layer 156, the first source electrode 148 and the first drain electrode 150 constitute the switching element $T_S$, and the second gate electrode 134, the second semiconductor layer 158, the second source electrode 152 and the second drain electrode 154 constitute the driving element $T_D$. The first drain electrode 150 is connected to the second gate electrode 134 through the first contact hole 181.

Figure 12A:
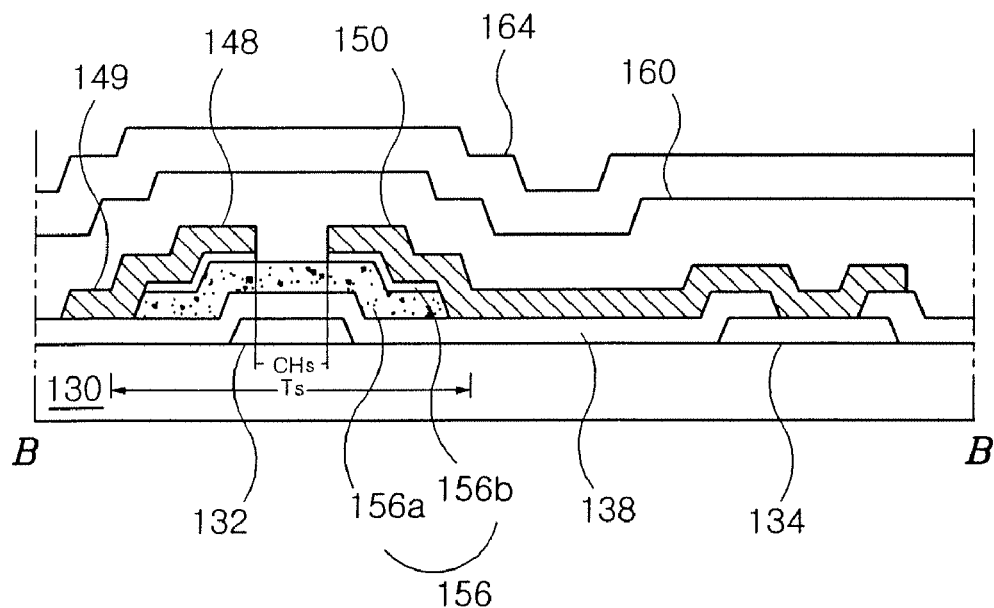
Figure 12B:
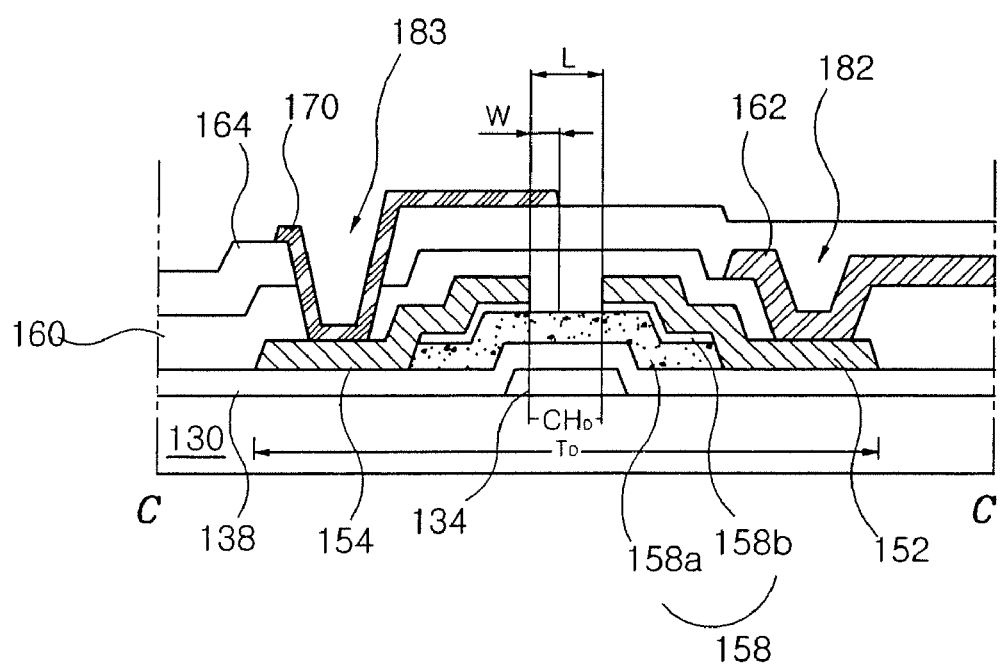

As shown in FIGS. 12A and 12B, a first passivation layer 160, a second insulating layer, is formed on the entire surface of the substrate 130 including the data line 149, the first source and drain electrodes 148 and 150, and the second source and drain electrodes 152 and 154 thereon by sequentially depositing and patterning one of an inorganic insulating material and an organic insulating material. The inorganic insulating material includes one of silicon nitride ($SiN_x$) and silicon oxide ($SiO_2$). The organic insulating material includes one of benzocyclobutene (BCB) and acrylic resin. The first passivation layer 160 includes a second contact hole 182 exposing the second source electrode 152.

A ground line 162 is formed on the first passivation layer 160 by sequentially depositing and patterning a metallic material. The ground line 162 is connected to the second source electrode 152 through the second contact hole 182. The ground line 162 is grounded, to thereby earth the second source electrode 152.

A second passivation layer 164, a third insulating layer, is formed on the entire surface of the substrate 130 including the ground line 162 thereon by sequentially depositing and patterning one of an inorganic insulating material and an organic insulating material. The inorganic insulating material includes one of silicon nitride ($SiN_x$) and silicon oxide ($SiO_2$). The organic insulating material includes one of benzocyclobutene (BCB) and acrylic resin. The second passivation layer 164 includes a third contact hole 183 exposing a portion of the second drain electrode 154 with the first passivation layer 160.

Next, a field control electrode 170 is formed on the second passivation layer 164 by sequentially depositing and patterning a metallic material, such as aluminum (Al), an aluminum alloy such as AlNd, tungsten (W), copper (Cu), molybdenum (Mo) and titanium (Ti). The field control electrode 170 is disposed over the driving element $T_D$, and the field control electrode 170 partially overlaps the channel $CH_D$ of the driving element $T_D$. The field control electrode 170 is connected to the second drain electrode 154 through the third contact hole 183. An overlapping width W between the field control electrode 170 and the channel $CH_D$ is shorter than a channel length (i.e., a distance between the second source and drain electrodes 152 and 154) L, and more particularly, W<L/2.

The field control electrode 170 may be simultaneously formed with the ground line 162.

Figure 13A:
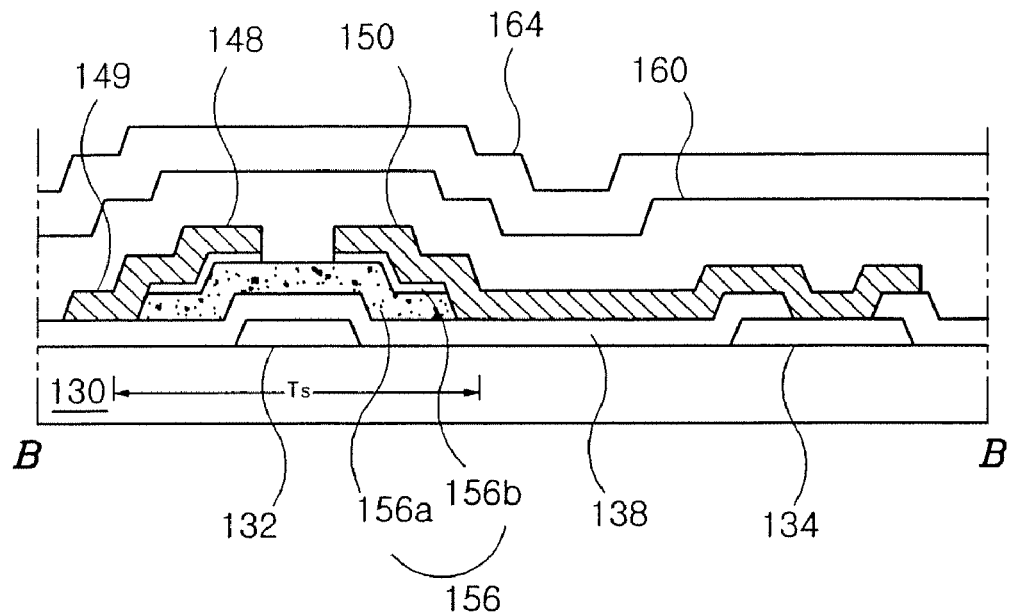
Figure 13B:
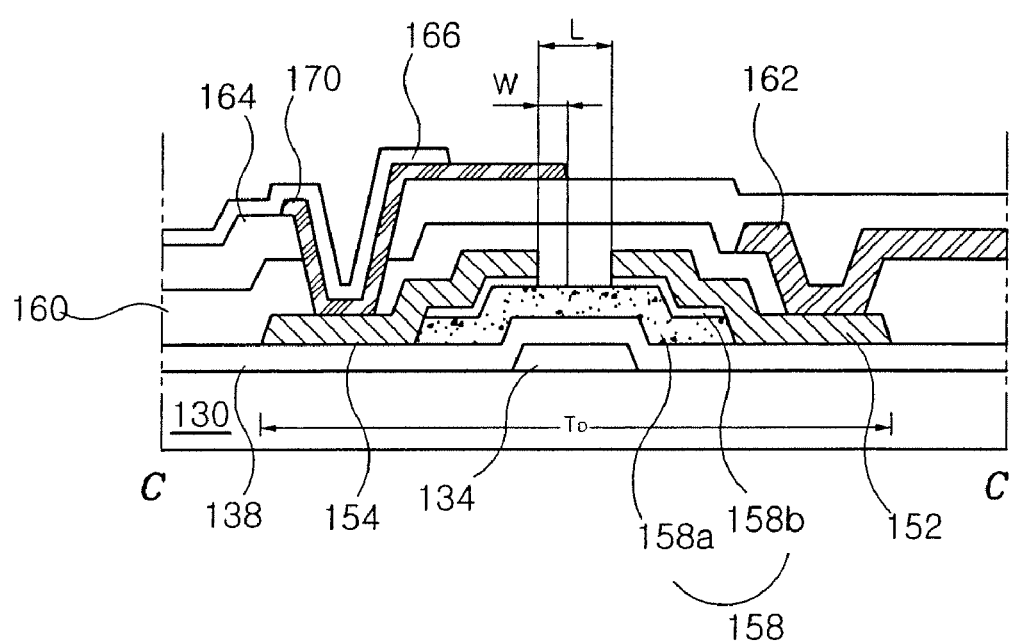

As shown in FIGS. 13A and 13B, a first electrode 166 is formed on the substrate 130 including the field control electrode 170 by sequentially depositing and patterning a metallic material. The first electrode 166 is formed in a pixel region defined by the gate line and the data line and is connected to the field control electrode 170.

Although not shown in the figures, an organic light-emitting layer and a second electrode are sequentially formed on the first electrode 166 in the next process.

In an exemplary embodiment of the present invention, the first electrode 166 functions as a cathode electrode and is formed of a metallic material having a relatively low work function, such as aluminum (Al), calcium (Ca), magnesium (Mg) and lithium-fluorine/aluminum (LiF/Al). On the other hand, the second electrode functions as an anode electrode and is formed of a conductive material having a relatively high work function indium tin oxide (ITO) and indium zinc oxide (IZO). The organic light-emitting layer can be a single layer or a multiple layer. When the organic light-emitting layer is a multiple layer, the organic light-emitting layer may include an electron injection layer adjacent to the first electrode 166 and a hole injection layer adjacent to the second electrode. Alternatively, the first electrode may function as an anode electrode while the second electrode may function as a cathode electrode.

Since the OELD device of an exemplary embodiment of the present invention includes the field control electrode over the driving element, which is connected to the drain electrode of the driving element and the organic electroluminescent diode, the external field applied to the gate electrode of the driving element is offset due to voltage of the field control electrode. Therefore, a surface potential between the second active layer and the gate insulating layer of the driving element is decreased, and current flowing through the organic electroluminescent diode is prevented from decreasing. Accordingly, reliability and life span of the driving element are improved.

It will be apparent to those skilled in the art that various modifications and variations can be made in the organic electroluminescent display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. A method of fabricating an organic electroluminescent display device, comprising:

forming a plurality of gate and data lines on a substrate, the gate and data lines crossing each other to define a pixel region;

forming a switching element at each crossing point of the gate and data lines;

forming a driving element electrically connected to the switching element;

forming a field control electrode electrically connected to the driving element and overlapping a channel of the driving element, wherein the channel of the driving element is disposed between the field control electrode and a gate electrode of the driving element; and forming an organic electroluminescent diode electrically connected to the driving element.

2. The method according to claim 1, wherein an overlapping width between the field control electrode and the channel of the driving element is shorter than a length of the channel of the driving element.

3. The method according to claim 2, wherein the length of the channel is two times longer than the overlapping width.

4. The method according to claim 1, wherein the switching element and the driving element are formed of amorphous silicon.

5. The method according to claim 1, wherein the forming the switching element includes forming a first gate electrode electrically connected to the gate line, forming a first source electrode electrically connected to the data line, and forming a first drain electrode spaced apart from the first source electrode, and the forming the driving element includes forming a second gate electrode electrically connected to the first drain electrode; a second source electrode grounded, and forming a second drain electrode electrically connected to the organic electroluminescent diode.

6. The method according to claim 5, wherein the second drain electrode is electrically connected to the field control electrode.

7. The method according to claim 1, wherein the forming the organic electroluminescent diode includes forming a first electrode electrically connected to the field control electrode, forming an organic light-emitting layer on the first electrode and forming a second electrode on the organic light-emitting layer and electrically connected to a power supply line.

8. The method according to claim 1, wherein the driving element includes a thin film transistor, and a drain electrode of the driving element is electrically connected to the field control electrode.

9. The method according to claim 8, wherein the thin film transistor includes one of an n-type and a p-type.

\* \* \* \* \*